US006811675B2

(12) United States Patent
Chen

(10) Patent No.: US 6,811,675 B2
(45) Date of Patent: Nov. 2, 2004

(54) APPARATUS AND METHOD FOR ELECTROLYTICALLY DEPOSITING COPPER ON A SEMICONDUCTOR WORKPIECE

(75) Inventor: Linlin Chen, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 347 days.

(21) Appl. No.: 09/885,232

(22) Filed: Jun. 20, 2001

(65) Prior Publication Data

US 2001/0042689 A1 Nov. 22, 2001

Related U.S. Application Data

(63) Continuation of application No. 09/387,033, filed on Aug. 31, 1999, now Pat. No. 6,290,833, which is a continuation of application No. PCT/US99/06306, filed on Mar. 22, 1999, which is a continuation-in-part of application No. 09/045,245, filed on Mar. 20, 1998, now Pat. No. 6,197,181.

(60) Provisional application No. 60/085,675, filed on May 15, 1998.

(51) Int. Cl.$^7$ .................................. C25D 3/38
(52) U.S. Cl. ........................ 205/291; 205/123; 205/125; 205/157; 205/196; 205/102; 205/104; 205/105; 205/103
(58) Field of Search ............................ 205/123, 125, 205/157, 291, 296, 102, 104, 105, 103

(56) References Cited

U.S. PATENT DOCUMENTS

| 3,267,010 A | 8/1966 | Creutz et al. |
|---|---|---|
| 3,328,273 A | 6/1967 | Creutz et al. |
| 3,664,933 A | 5/1972 | Clauss |
| 3,716,462 A | 2/1973 | Jensen |
| 3,770,598 A | 11/1973 | Creutz et al. |
| 3,878,066 A | 4/1975 | Dettke et al. |
| 3,930,963 A | 1/1976 | Polichette et al. |
| 4,000,046 A | 12/1976 | Weaver |
| 4,134,802 A | 1/1979 | Herr |
| 4,272,335 A | 6/1981 | Combs |
| 4,279,948 A | 7/1981 | Kukanskis et al. |
| 4,576,689 A | 3/1986 | Makkaev et al. |
| 4,624,749 A | 11/1986 | Black et al. |
| 4,959,278 A | 9/1990 | Shimauchi et al. |
| 4,990,224 A | 2/1991 | Mahmoud |
| 5,021,129 A | 6/1991 | Arbach et al. |
| 5,115,430 A | 5/1992 | Hirdi et al. |
| 5,151,168 A | 9/1992 | Gilton et al. |
| 5,209,817 A | 5/1993 | Ahmed et al. |
| 5,252,196 A * | 10/1993 | Sonnenberg et al. ........ 205/296 |
| 5,284,548 A | 2/1994 | Carey et al. |
| 5,372,848 A | 12/1994 | Blackwell et al. |
| 5,409,587 A | 4/1995 | Sandhu et al. |
| 5,443,865 A | 8/1995 | Tisdale et al. |
| 5,472,592 A | 12/1995 | Lowery |
| 5,482,891 A | 1/1996 | Shieh et al. |
| 5,549,808 A | 8/1996 | Farooq et al. |
| 5,576,052 A | 11/1996 | Arledge et al. |
| RE35,513 E * | 5/1997 | Nobel et al. ................. 205/263 |
| 5,639,316 A | 6/1997 | Cabral, Jr. et al. |
| 5,674,787 A | 10/1997 | Zhao et al. |
| 5,695,810 A | 12/1997 | Dubin et al. |
| 5,719,447 A | 2/1998 | Gardner |
| 5,723,387 A | 3/1998 | Chen |
| 5,730,854 A | 3/1998 | Martin |
| 5,824,599 A | 10/1998 | Schacham-Diamand et al. |
| 5,882,498 A | 3/1999 | Dubin et al. |
| 5,891,513 A | 4/1999 | Dubin et al. |
| 5,897,368 A | 4/1999 | Cole, Jr. et al. |
| 5,908,543 A | 6/1999 | Matsunami et al. |
| 5,913,147 A | 6/1999 | Dubin et al. |
| 5,932,077 A | 8/1999 | Reynolds |
| 5,969,422 A | 10/1999 | Ting et al. |
| 5,972,192 A | 10/1999 | Dubin et al. |
| 6,036,836 A | 3/2000 | Peeters et al. |
| 6,065,424 A | 5/2000 | Schacham-Diamand et al. |
| 6,069,068 A | 5/2000 | Rathore et al. |
| 6,113,771 A | 9/2000 | Landau et al. |
| 6,197,181 B1 | 3/2001 | Chen |
| 6,197,688 B1 | 3/2001 | Simpson |
| 6,309,524 B1 | 10/2001 | Woodruff et al. |
| 6,319,831 B1 | 11/2001 | Tsai et al. |
| 6,565,731 B1 * | 5/2003 | Couble et al. ............... 205/125 |

FOREIGN PATENT DOCUMENTS

| GB | 2 285 174 A | 12/1994 |
|---|---|---|
| JP | 52-16433 | 7/1975 |
| JP | 5-142262 | 6/1993 |
| WO | WO 99/47731 | 9/1999 |

OTHER PUBLICATIONS

U.S. patent application Ser. No. 09/738,551, Morrissey et al., filed Jan. 3, 2002.
U.S. patent application Ser. No. 09/900,710, Dordi et al., filed Apr. 18, 2002.
Ali, Hassan O. et al., "A Review of Electroless Gold Deposition Processes," Gold Bull (1984) pp. 118–127, 17, (4), No Month avail.

(List continued on next page.)

Primary Examiner—Wesley A. Nicolas
(74) Attorney, Agent, or Firm—Perkins Coie LLP

(57) ABSTRACT

This invention employs a novel approach to the copper metallization of a workpiece, such as a semiconductor workpiece. In accordance with the invention, an alkaline electrolytic copper bath is used to electroplate copper onto a seed layer, electroplate copper directly onto a barrier layer material, or enhance an ultra-thin copper seed layer which has been deposited on the barrier layer using a deposition process such as PVD. The resulting copper layer provides an excellent conformal copper coating that fills trenches, vias, and other microstructures in the workpiece. When used for seed layer enhancement, the resulting copper seed layer provide an excellent conformal copper coating that allows the microstructures to be filled with a copper layer having good uniformity using electrochemical deposition techniques. Further, copper layers that are electroplated in the disclosed manner exhibit low sheet resistance and are readily annealed at low temperatures.

27 Claims, 10 Drawing Sheets

OTHER PUBLICATIONS

Benedetti, A.V. et al., "Electrochemical Studies of Copper, Copper–Aluminum and Copper–Aluminum–Silver Alloys: Impedance Results in 0.5M NaCl," Electrochimica Acta (Mar. 1995) pp. 000, vol. 40, Great Britain.

Bindra, Perminder et al., "Fundamental Aspects of Electroless Copper Plating," Electroless Plating Fundamentals & Applications (Jan. 1990) pp. 289–375, Noyes Data Corporation/Noyes Publications.

Despic, Aleksandar R., "Deposition and Dissolution of Metals and Alloys, Part B: Mechanisms, Kinetics, Texture, and Morphology," Comprehensive Treatise of Electrochemistry vol. 7: Kinetics and Mechanisms of Electrode Processes (1983) pp. 451–527, Plenum Press, New York and London, No Month avail.

Desilva, Melvin J. et al., "A Novel Seed Layer Scheme to Protect Catalytic Surfaces for Electroless Deposition," J. Electrochem. Soc. (Nov. 1996) pp. 3512–3516, vol. 143, No. 11.

Dubin, V.M. et al., "Copper Plating Techniques For ULSI Metallization," Advanced Metallization and Interconnect Systems for ULSI Application in 1997: Materials Research Society Symposium Proceedings, (Jan. 1998) pp. 405–411, Materials Research Society, Warrendale.

Dubin, V. et al., "Copper Electroplating for On–chip Metallization," 11 pp., Advanced Micro Devices, Sunnyvale, No date avail.

Dubin, V.M. et al., "Sub–Half Micron Electroless Cu Metallization," Materials Research Society Symposium Proceedings, (Jan. 1996) pp. 179–184, vol. 427, Materials Research Society.

Dubin, V.M. et al., "Selective and Blanket Electroless Copper Deposition for Ultralarge Scale Integration," J. Electrochem. Soc. (Mar. 1997) pp. 898–908, vol. 144, No. 3, The Electrochemical Society, Inc., Pennington, NJ.

Fujinami, T. et al., "Electroless Copper Plating on PZT Ceramic," Plating & Surface Finishing (May 1998) pp. 100–104.

Gabe, D.R., "Principles of Metal Surface Treatment and Protection," Second Edition (1978), Chapters 1, 2, and 8, 198 pp, Pergamon Press, Great Britain, No Month avail.

Gignac, L.M. et al., "Characterization of Plated Cu Thin Film Microstructures," Material Research Society Symposium Proceedings vol. 564: Advanced Interconnects and Contacts (Apr. 1999) pp. 373–434, Materials Research Society, Warrendale.

Kang, S. et al., "Relationship Between Texture and Surface Morphology of Copper Electrodeposits," Plating & Surface Finishing (Oct. 1995) pp. 67–70.

Kelly, J.J. et al., "Copper Deposition in the Presence of Polyethylene Glycol: I. Quartz Crystal Microbalance Study," J. Electrochem. Soc. (Oct. 1998) pp. 3472–3481, vol. 145, No. 10, The Electrochemical Society, Inc.

Khera, R.P., "The Basic Principles of Electrolytic Deposition," pp. 69–84, No date avail.

Krishnan, R.M. et al., "Electroplating of Copper from a Non–cyanide Electrolyte," Plating & Surface Finishing (Jul. 1995) pp. 56–59, vol. 82, No. 7.

Kröger, R. et al., "Properties of Copper Films Prepared by Chemical Vapor Deposition for Advanced Metallization of Microelectronic Devices," Journal of the Electrchemical Society (1999) pp. 3248–3254, vol. 146, No. 9, No month avail.

Lopatin, S. et al., "Electroless Cu and Barrier Layers for Sub–Half Micron Multilevel Interconnects," Multilevel Interconnect Technology, Conference 3214, SPIE (Oct. 1997) pp. 21–32, vol. 3214.

Lopatin, S. et al., "Extendibility of Ion–Metal Plasma and Electroplating Technologies for Damascence–Based Copper Metallization," 7 pp., Advanced Micro Devices, Sunnyvale, no date avail.

Lopatin, S. et al., "Conformal Electroless Copper Deposition For Sub—0.5 µm Interconnect Wiring of Very High Aspect Ration," Proceedings of the Third Symposium on Electrochemcially Deposited Thin Films (1997) pp. 271–288, vol. 96–19, The Electrochemical Society, Inc., Pennington, no month avail.

Lowenheim, F.A. et al. (Eds.), "Gold" Modern Electroplating, Third Edition (1974) pp. 224–244, John Wiley * Sons, Inc., New York, no month avail.

Lowenheim, F.A. et al. (Eds.), "Electroless Plating," Modern Electroplating, Third Edition (1974) pp. 710–747, John Wile & Sons, Inc., New York, no month avail.

Murarka, S.P. et al., "Copper Metallization of ULSI and Beyond," Critical Reviews in Solid State and Materials Sciences (1995) pp. 87–124, vol. 20, No, no month avail.

Murarka, S.P. "Metallization: Theory and Practice for VLSI and ULSI," 256 pp. (1993) Reed Publishing (USA), no month avail.

Nobe, K., "Electrodissolution Kinetics of Metals and Alloys," 17 pp. Department of Chemical Enginereing, University of California, Los Angeles, no date avail.

Oskam, G. et al., "Electrochemical Deposition of Copper on a n–Si/TiN," Journal of The Electrochemical Society (1999) pp. 1436–1441, vol. 146, No. 4, no month avail.

Palmans R., et al., "Development of An Electroless Copper Deposition Bath For Via Fill Applications on Tin Seed Layers," Advanced Metallization for ULSI Applications in 1994: Materials Research Society Symposium Proceedings, (Jan. 1995) pp. 87–94 Materials Research Society, Pittsburgh.

Reid, J.D. et al., "Impedance Behavior of a Sulfuric Acid–Cupric Sulfate/Copper Cathode Interface," J. Electrochem Society: Electrochemical Science and Technology (Jun. 1987) pp. 1389–1394, vol. 134, No. 6.

Sato, N., "Toward a More Fundamental Understanding of Corrosion Processes," Corrosion (May 1989) pp. 354–367, vol. 45, No. 5.

Schlesinger, M. et al. (Eds.), "Electrodeposition of Gold," Modern Electroplating, Fourth Edition (2000) pp. 201–225, John Wiley & Sons, Inc. (USA), no month avail.

Schlesinger, M. et al., "Electroless Deposition of Nickel," Modern Electroplating, Fourth Edition (2000) pp. 667–684 John Wiley & Sons, Inc. (USA).

Shacham–Diamand, Y., "Electroless Copper for Micropackaging and Ultralarge–Scale Integrated Circuit Applications," Materials for Electronic Packaging (1995) pp. 221–240, Butterworth–Heinemann, Newton, no month avail.

Shacham–Diamand, Y. et al., "Electroless Copper Deposition for ULSI," Thin Solid Films 262 (1995) pp. 93–103, no month avail.

Shacham–Diamand, Y. et al., "0.35 µm Cu–Filled Via Holes By Blanket Deposited Electroless Copper on Sputtered Seed Layer," 3 pp, Sematech, Austin, no month avail.

Smy, T. et al., "Simulation of Electroless Deposition of Cu Thin Films for Very Large Scale Integration Metallization," Journal of The Electrochemical Society (Jun. 1997), pp. 2115–2122, vol. 144, No. 6, The Electrochemical Society, Inc.

Steigerwald, J.M. et al., "Electrochemical Potential Measurements during the Chemical–Mechanical Polishing of Copper Thin Films," Journal of the Electrochemical Society (Jul. 1995) pp. 2379–2385, vol. 142, No. 7, The Electrochemical Society, Inc.

Taylor, T. et al., "Electrolyte Composition Monitoring For Copper Interconnect Applications," Preseneted at $193^{rd}$ Meeting of the Electrochemical Society, 26 pp., Semitool, Inc. Kalispell, no date avail.

Wünsche, M. et al., "Morphology and Stability of Electrochemically Generated Copper Layers: The Effect of Electron Transfer and Nucleation Kinetics," Circuit World (1996) pp. 4–9, vol. 22, No. 3, no month avail.

Yoshiki, H. et al., "Adhesion Mechanism of Electroless Copper Film Formed on Ceramic Substrates Using ZnO Thin Film as an Intermediate Layer," J. Electrochem. Soc. (May 1998) pp. 1430–1434, vol. 145, No. 5, The Electrochemical Society, Inc.

Yung, E.K. et al., "Fundamental Study of Acid Copper Through–Hole Electroplating Process," J. Electrochem. Soc. (Mar. 1989) pp. 756–767, vol. 136, No. 3, The Electrochemical Society, Inc.

Yung, E.K. et al., "Plating of Copper into Through–Holes and Vias," J. Electrochem. So. (Jan. 1989) pp. 206–215, vol. 136, No. 1, The Electrochemical Society, Inc.

L'Augmentation Du Courant Limite Par Les Differentes Formes D'Electrodes, 20 pp., no date avail.

* cited by examiner

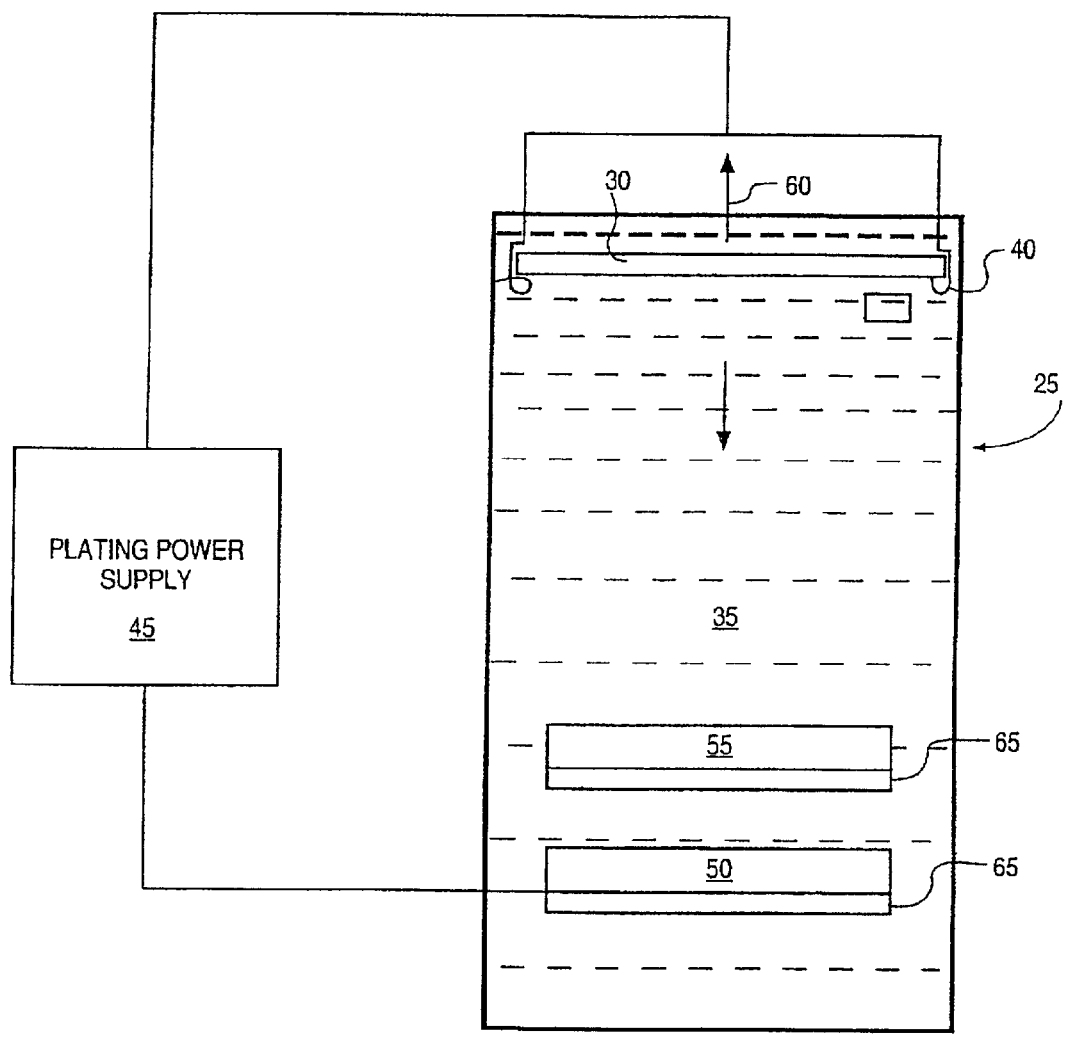

APPARATUS AND METHOD FOR ELECTROLYTICALLY DEPOSITING COPPER ON A SEMICONDUCTOR WORKPIECE

This application is a continuation of U.S. application Ser. No. 09/387,033 filed Aug. 31, 1999, now U.S. Pat. No. 6,290,833, which is a continuation of International Application Ser. No. PCT/US99/06306 designating the United States filed Mar. 22, 1999, which is a continuation-in-part of U.S. application Ser. No. 09/045,245 filed Mar. 20, 1998, now U.S. Pat. No. 6,197,181, and claims the benefit of U.S. Provisional Application Ser. No. 60/085,675 filed May 15, 1998, priority from the filing dates of which are hereby claimed under 35 USC Sections 120 and 119(e), and the disclosures of which are hereby incorporated in their entirety.

BACKGROUND OF THE INVENTION

In the fabrication of microelectronic devices, application of one or more metallization layers is often an important step in the overall fabrication process. The metallization may be used in the formation of discrete microelectronic components, such as read/write heads, but it is more often used to interconnect components formed on a workpiece, such as a semiconductor workpiece. For example, such structures are used to interconnect the devices of an integrated circuit.

A basic understanding of certain terms used herein will assist the reader in understanding the disclosed subject matter. To this end, basic definitions of certain terms, as used in the present disclosure, are set forth below.

Single Metallization Level is defined as a composite level of a workpiece that is exterior to the substrate. The composite level comprises one or more metal structures.

Substrate is defined as a base layer of material over which one or more metallization levels are disposed. The substrate may be, for example, a semiconductor wafer, a ceramic block, etc.

Workpiece is defined as an object that at least comprises a substrate, and may include further layers of material or manufactured components, such as one or more metallization levels, disposed on the substrate.

An integrated circuit is an interconnected ensemble of devices formed within a semiconductor material and within a dielectric material that overlies a surface of the semiconductor. Devices which may be formed within the semiconductor include MOS transistors, bipolar transistors, diodes and diffused resistors. Devices which may be formed within the dielectric include thin-film resistors and capacitors. Typically, more than 100 integrated circuit die (IC chips) are constructed on a single 8 inch diameter silicon wafer. The devices utilized in each dice are interconnected by conductor paths formed within the dielectric. Typically, two or more levels of conductor paths, with successive levels separated by a dielectric layer, are employed as interconnections. In current practice, an aluminum alloy and silicon oxide are typically used for, respectively, the conductor and dielectric.

Delays in propagation of electrical signals between devices on a single die limit the performance of integrated circuits. More particularly, these delays limit the speed at which an integrated circuit may process these electrical signals. Larger propagation delays reduce the speed at which the integrated circuit may process the electrical signals, while smaller propagation delays increase this speed. Accordingly, integrated circuit manufacturers seek ways in which to reduce the propagation delays.

For each interconnect path, signal propagation delay may be characterized by a time delay $\tau$. See E. H. Stevens, *Interconnect Technology*, QMC, Inc., July 1993. An approximate expression for the time delay, $\tau$, as it relates to the transmission of a signal between transistors on an integrated circuit is given below.

$$\tau = RC[1 + (V_{SAT}/RI_{SAT})]$$

In this equation, R and C are, respectively, an equivalent resistance and capacitance for the interconnect path and $I_{SAT}$ and $V_{SAT}$ are, respectively, the saturation (maximum) current and the drain-to-source potential at the onset of current saturation for the transistor that applies a signal to the interconnect path. The path resistance is proportional to the resistivity, $\rho$, of the conductor material. The path capacitance is proportional to the relative dielectric permittivity, $K_c$, of the dielectric material. A small value of $\tau$ requires that the interconnect line carry a current density sufficiently large to make the ratio $V_{SAT}/RI_{SAT}$ small. It follows therefore, that a low-$\rho$ conductor which can carry a high current density and a low-$K_c$ dielectric must be utilized in the manufacture of high-performance integrated circuits.

To meet the foregoing criterion, copper interconnect lines within a low-$K_c$ dielectric will likely replace aluminum-alloy lines within a silicon oxide dielectric as the most preferred interconnect structure. See "Copper Goes Mainstream: Low-k to Follow", *Semiconductor International*, November 1997, pp. 67–70. Resistivities of copper films are in the range of 1.7 to 2.0 $\mu\Omega$cm.; resistivities of aluminum-alloy films are in the range of 3.0 to 3.5 $\mu\Omega$cm.

Despite the advantageous properties of copper, it has not been as widely used as an interconnect material as one would expect. This is due, at least in part, to the difficulty of depositing copper metallization and, further, due to the need for the presence of barrier layer materials. The need for a barrier layer arises from the tendency of copper to diffuse into silicon junctions and alter the electrical characteristics of the semiconductor devices formed in the substrate. Barrier layers made of, for example, titanium nitride, tantalum nitride, etc., must be laid over the silicon junctions and any intervening layers prior to depositing a layer of copper to prevent such diffusion.

A number of processes for applying copper metallization to semiconductor workpieces have been developed in recent years. One such process is chemical vapor deposition (CVD), in which a thin copper film is formed on the surface of the barrier layer by thermal decomposition and/or reaction of gas phase copper compositions. A CVD process can result in conformal copper coverage over a variety of topological profiles, but such processes are expensive when used to implement an entire metallization layer.

Another known technique, physical vapor deposition (PVD), can readily deposit copper on the barrier layer with relatively good adhesion when compared to CVD processes. One disadvantage of PVD processes, however, is that they result in poor (non-conformal) step coverage when used to fill microstructures, such as vias and trenches, disposed in the surface of the semiconductor workpiece. For example, such non-conformal coverage results in less copper deposition at the bottom and especially on the sidewalls of trenches in the semiconductor devices.

Inadequate deposition of a PVD copper layer into a trench to form an interconnect line in the plane of a metallization layer is illustrated in FIG. 1. As illustrated, the upper portion of the trench is effectively "pinched off" before an adequate amount of copper has been deposited within the lower portions of the trench. This result in an open void region that seriously impacts the ability of the metallization line to carry the electrical signals for which it was designed.

Electrochemical deposition of copper has been found to provide the most cost-effective manner in which to deposit a copper metallization layer. In addition to being economically viable, such deposition techniques provide substantially conformal copper films that are mechanically and electrically suitable for interconnect structures. These techniques, however, are generally only suitable for applying copper to an electrically conductive layer. As such, an underlying conductive seed layer is generally applied to the workpiece before it is subject to an electrochemical deposition process. Techniques for electrodeposition of copper on a barrier layer material have not heretofore been commercially viable.

The present inventors have recognized that there exists a need to provide copper metallization processing techniques that 1) provide conformal copper coverage with adequate adhesion to the barrier layer, 2) provide adequate deposition speeds, and 3) are commercially viable. These needs are met by the apparatus and processes of the present invention as described below.

BRIEF SUMMARY OF THE INVENTION

This invention employs a novel approach to the copper metallization of a workpiece, such as a semiconductor workpiece. In accordance with the invention, an alkaline electrolytic copper bath is used to electroplate copper onto a seed layer, electroplate copper directly onto a barrier layer material, or enhance an ultra-thin copper seed layer which has been deposited on the barrier layer using a deposition process such as PVD. The resulting copper layer provides an excellent conformal copper coating that fills trenches, vias, and other microstructures in the workpiece. When used for seed layer enhancement, the resulting copper seed layer provide an excellent conformal copper coating that allows the microstructures to be filled with a copper layer having good uniformity using electrochemical deposition techniques. Further, copper layers that are electroplated in the disclosed manner exhibit low sheet resistance and are readily annealed at low temperatures.

The disclosed process, as noted above, is applicable to a wide range of steps used in the manufacture of a metallization layer in a workpiece. The workpiece may, for example, be a semiconductor workpiece that is processed to form integrated circuits or other microelectronic components. Without limitation as to the applicability of the disclosed invention, a process for enhancing a seed layer is described.

A process for applying a metallization interconnect structure to a workpiece having a barrier layer deposited on a surface thereof is also set forth. The process includes the forming of an ultra-thin metal seed layer on the barrier layer. The ultra-thin seed layer has a thickness of less than or equal to about 500 Angstroms and may be formed from any material that can serve as a seed layer for subsequent metal deposition. Such metals include, for example, copper, copper alloys, aluminum, aluminum alloys, nickel, nickel alloys, etc. The ultra-thin seed layer is then enhanced by depositing additional metal thereon in a separate deposition step, to provide an enhanced seed layer that is suitable for use in a primary metal deposition. The enhanced seed layer has a thickness at all points on sidewalls of substantially all recessed features distributed within the workpiece that is equal to or greater than about 10% of the nominal seed layer thickness over an exteriorly disposed surface of the workpiece.

In accordance with a specific embodiment of the process, a copper-containing metallization interconnect structure is formed. To this end, the ultra-thin seed layer is enhanced by subjecting the semiconductor workpiece to an electrochemical copper deposition process in which an alkaline bath having a complexing agent is employed. The copper complexing agent may be at least one complexing agent selected from a group consisting of EDTA, ED, and a polycarboxylic acid such as citric acid or salts thereof.

Various plating bath compositions suitable for blanket plating, fill-plating of recessed micro-structures, and seed layer enhancement plating are also set forth. A preferred solution for electroplating copper for seed layer enhancement comprises copper sulfate, boric acid, and a complexing agent. The complexing agent is preferably selected from the group consisting of ED, EDTA, and a polycarboxylic acid, such as citric acid. This solution is also suitable for blanket plating and fill-plating of recessed microstructures.

A plating solution that improves the resistivity of the resulting copper film is also set forth. The plating solution preferably comprises copper sulfate, ammonium sulfate, and ethylene glycol. This solution is also suitable for blanket plating and fill-plating of recessed micro-structures.

BRIEF DESCRIPTION OF THE SEVERAL VIEWS OF THE DRAWINGS

FIG. 3 is a schematic representation of an apparatus suitable for enhancing an ultra-thin seed layer.

DETAILED DESCRIPTION OF THE INVENTION

This invention employs a novel approach to applying copper metallization to a workpiece, such as a semiconductor workpiece. In accordance with the invention, an alkaline electrolytic copper bath is used to electroplate copper onto a seed layer, electroplate copper directly onto a barrier layer material, or enhance an ultra-thin copper seed layer which has been deposited on the barrier layer using a deposition process such as PVD. Additionally, a method for applying a metallization layer will be disclosed. Although the disclosed method may be used in connection with a substantial number of different metal compositions, the specific embodiment disclosed herein is directed to the application of a copper-containing metallization layer. To this end, an alkaline electrolytic copper bath is used to enhance an ultra-thin copper seed layer which has been deposited on a barrier layer using a deposition process such as PVD. The enhanced copper seed layer provides an excellent conformal copper coating that allows trenches and vias to be subsequently filled with a copper layer having good uniformity using electrochemical deposition techniques.

Figure 1:
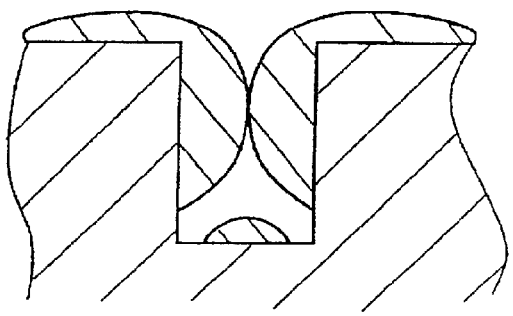
FIG. 1 is a cross-sectional view illustrating an interconnect line formed completely by PVD copper.
Figure 2A:
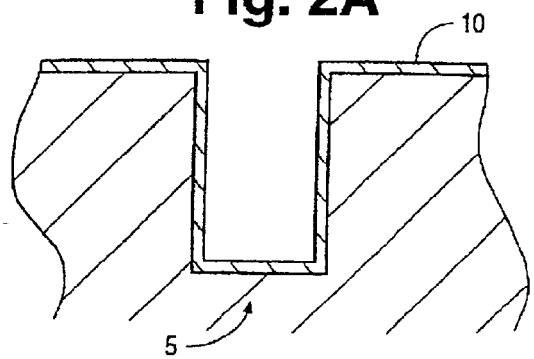
FIGS. 2A–2E are cross-sectional views through a semiconductor workpiece illustrating the various layers of material as they are applied in accordance with one embodiment of the present inventions

A cross-sectional view of a micro-structure, such as trench 5, that is to be filled with copper metallization is illustrated in FIG. 2A and will be used to to describe the seed layer enhancement aspects of the present invention. As shown, a thin barrier layer 10 of, for example, titanium nitride or tantalum nitride is deposited over the surface of a semiconductor device or, as illustrated in FIG. 2A, over a layer of a dielectric 8, such as silicon dioxide. The barrier layer 10 acts to prevent the migration of copper to any semiconductor device formed in the substrate. Any of the various known techniques, such as CVD or PVD, can be used to deposit the barrier layer depending on the particular barrier material being used. Preferably, the thickness for the barrier layer is approximately 100 to 300 Angstroms.

Figure 2B:
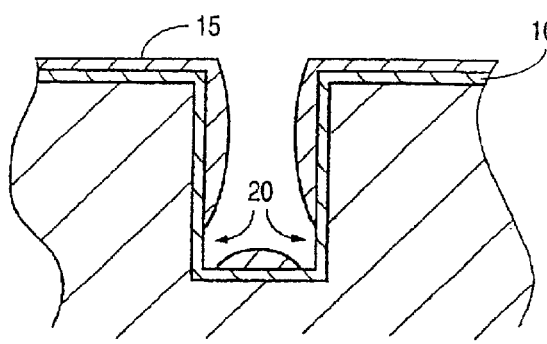

After the deposition of the barrier layer, an ultra-thin copper seed layer 15 is deposited on the barrier layer 10. The resulting structure is illustrated in FIG. 2B. Preferably, the copper seed layer 15 is formed using a vapor deposition technique, such as CVD or PVD. In order to have adequate adhesion and copper coverage, a relatively thick (1000 Angstroms) copper seed layer is usually required. Such a thick seed layer leads to problems with close-off of small geometry trenches, however, when a PVD deposition process is employed for applying the seed layer.

Contrary to traditional thoughts regarding seed layer application, the copper seed layer 15 of the illustrated embodiment is ultra-thin, having a thickness of about 50 to about 500 Angstroms, preferably about 100 to about 250 Angstroms, and most preferably about 200 Angstroms. The ultra-thin copper seed layer can be deposited using a CVD or a PVD process, or a combination of both PVD is the preferred application process, however, because it can readily deposit copper on the barrier layer 10 with relatively good adhesion. By depositing an ultra-thin seed layer of copper, rather than the relatively thick seed layer used in the prior art, pinching off of the trenches can be avoided.

The use of an ultra-thin seed layer 15 generally introduces its own set of problems. One of the most significant of these problems is the fact that such ultra-thin layers do not generally coat the barrier layer 10 in a uniform manner. Rather, voids or non-continuous seed layer regions on the sidewalls, such as at 20, are often present in an ultra-thin seed layer 15 thereby resulting in the inability to properly apply a subsequent electrochemically deposited copper layer in the regions 20. Further, ultra-thin seed layers tend to include spikes, such as at 21, that impact the uniformity of the subsequent electrolytically deposited metal layer. Such spikes 21 result in high potential regions at which the copper deposits at a higher rate than at other, more level regions. As such, the seed layer 15 is not fully suitable for the traditional electroplating techniques typically used after application of a seed layer.

Figure 2C:
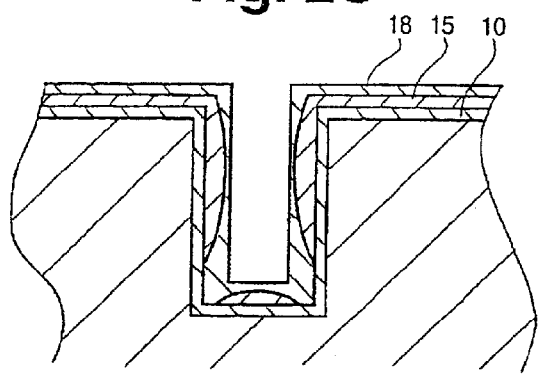

The present inventors have found that an ultra-thin seed layer can be employed if it is combined with a subsequent electrochemical seed layer enhancement technique. To this end, the semiconductor workpiece is subject to a subsequent process step in which a further amount of copper 18 is applied to the ultra-thin seed layer to thereby enhance the seed layer. A seed layer enhanced by the additional deposition of copper is illustrated in FIG. 2C. As shown in FIG. 2C, the void or non-continuous regions 20 of FIG. 2B have been filled thereby leaving substantially all of the barrier layer 10 covered with copper.

Preferably, the seed layer enhancement process continues until a sidewall step coverage, i.e., the ratio of the seed layer thickness at the bottom sidewall regions 22 to the nominal thickness of the seed layer at the exteriorly disposed side 23 of the workpiece, achieves a value of at least 10%. More preferably, the sidewall step coverage is at least about 20%. Such sidewall step coverage values are present in substantially all of the recessed structures of the semiconductor workpiece. It will be recognized, however, that certain recessed structures distributed within the semiconductor workpiece may not reach these sidewall step coverage values. For example, such structures disposed at the peripheral edges of a semiconductor wafer may not reach these step coverage values. Similarly, defects or contaminants at the situs of certain recessed structures may prevent them from reaching the desired coverage values. The nominal thickness of the enhanced seed layer at the exteriorly disposed side of the workpiece is preferably in the range of 500 angstroms 1600 angstroms.

Although the embodiment of the process disclosed herein is described in connection with copper metallization, it is understood that the basic principle of the enhancement of an ultra-thin seed layer prior to the bulk deposition thereof can be applied to other metals or alloys that are capable of being electroplated. Such metals include iron, nickel, cobalt, zinc, copper-zinc, nickel-iron, cobalt-iron, etc.

A schematic representation of an apparatus 25 suitable for enhancing the ultra-thin copper seed layer is illustrated in FIG. 3. It will be recognized that this apparatus is also suitable for applying a blanket plating layer and/or full-fill plating of recessed micro-structures As shown, a semiconductor workpiece, such as a semiconductor wafer 30, is positioned face down in a bath 35 of electroplating solution. One or more contacts 40 are provided to connect the wafer 30 to a plating power supply 45 as a cathode of an electroplating cell. An anode 50 is disposed in the bath 35 and is connected to the plating power supply 45. Preferably, a diffuser 55 is disposed between the anode 50 and the wafer/cathode 30. The wafer 30 may be rotated about axis 60 during the enhancement process. Anode 50 may be provided with a dielectric shield 65 at a backside thereof which faces an incoming stream of plating bath fluid.

As noted above, certain aspects of the present invention relate to new and useful plating solutions. These solutions can be used for blanket plating, full-fill of the recessed micro-structures, seed layer enhancement, etc. The preferred electrolytic bath solution for enhancing the seed layer is an alkaline copper bath in which copper ions are complexed with a complexing agent. A preferred composition and range of concentrations for the various components of the plating bath include the following:

1. Copper sulfate: 0.03 M to 0.25 M (preferably, 0.04);
2. Complexing agent: complex to metal ratios from 1 to 4, preferably 2;

3. Boric acid: 0.01 M to 0.5 M, preferably 0.05 M; and
4. pH: 5–13, preferably 9.5.

A preferred source of copper ions is copper sulfate ($CuSO_4$). The concentration of copper sulfate in the bath is preferably within the range of 0.03 to 0.25 M, and is more preferably about 0.1 M.

Complexing agents that are suitable for use in the present invention form a stable complex with copper ions and prevent the precipitation of copper hydroxide. Ethylene diamine tetracetic acid (EDTA), ethylene diamine (ED), citric acid, and their salts have been found to be particularly suitable copper complexing agents. The molar ratio of complexing agent to copper sulfate in the bath is preferably within the range of 1 to 4, and is preferably about 2. Such complexing agents can be used alone, in combination with one another, or in combination with one or more further complexing agents.

The electrolytic bath is preferably maintained at a pH of at least 9.0. Potassium hydroxide, ammonium hydroxide, tetramethylammonium hydroxide, or sodium hydroxide is utilized to adjust and maintain the pH at the desired level of 9.0 or above. A preferred pH for a citric acid or ED bath is about 9.5, while a preferred pH for an EDTA bath is about 12.5: As noted above, the complexing agent assists in preventing the copper from precipitating at the high pH level.

Additional components can be added to the alkaline copper bath For example, boric acid ($H_3BO_3$) aids in maintaining the pH at 9.5 when citric acid or ED is used as the complexing agent, and provides brighter copper deposits when added to an electrolytic bath containing EDTA as the complexing agent. If boric acid is added, its concentration in the bath is preferably within the range of 0.01 to 0.5 M.

In general, the temperature of the bath can be within the range of 20 to 35° C., with 25° C. being a preferred temperature. The current density for electrolytically depositing copper to enhance the copper seed layer can be 1 to 5 milliamps/$cm^2$, while a plating time of about 1 to about 5 minutes is sufficient to enhance the copper seed layer. The plating waveform may be, for example, a forward periodic pulse having a period of 2 msec at a 50% duty cycle.

An amine free acid complexing agent, for example, a polycarboxylic acid, such as citric acid, and salts thereof, is preferable to the use of EDTA or ED. EDTA and ED include amine groups. These amine groups often remain on the surface of the semiconductor workpiece after rinsing and drying of the wafer. Subsequent processes, particularly such processes as photolithographic processes, may be corrupted by the reactions resulting from the presence of these amine groups. The amine groups may, for example, interfere with the chemical reactions associated with the exposing and/or curing of photoresist materials. As such, amine free complexing agents are particularly suitable in processes in which a photolithographic process follows an electrodeposition process.

Figure 4A:
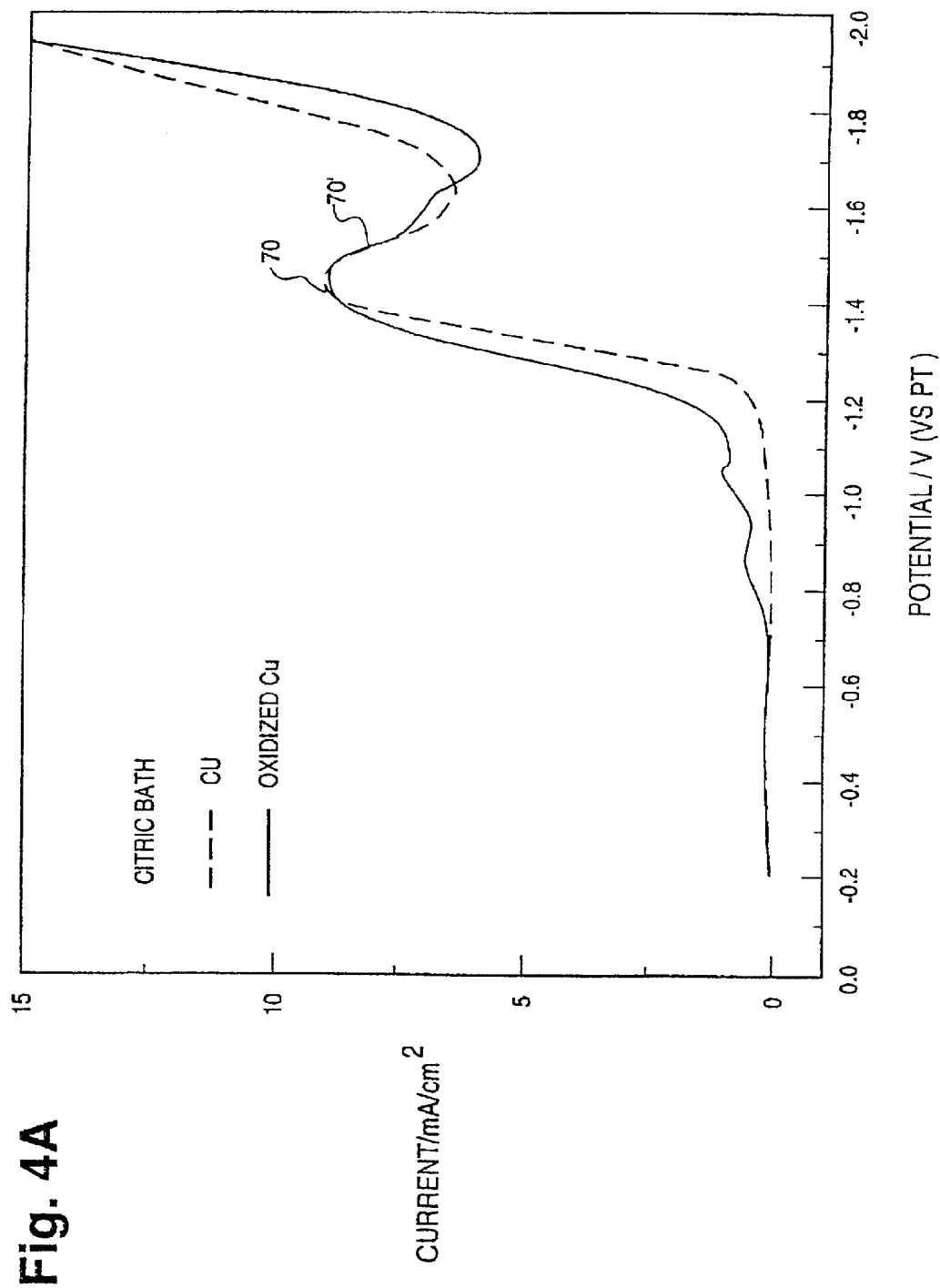
FIG. 4A is a graph illustrating the current-potential curves of a plating solution using a polycarboxylic acid, such as citric acid, as a complexing agent.
Figure 4B:
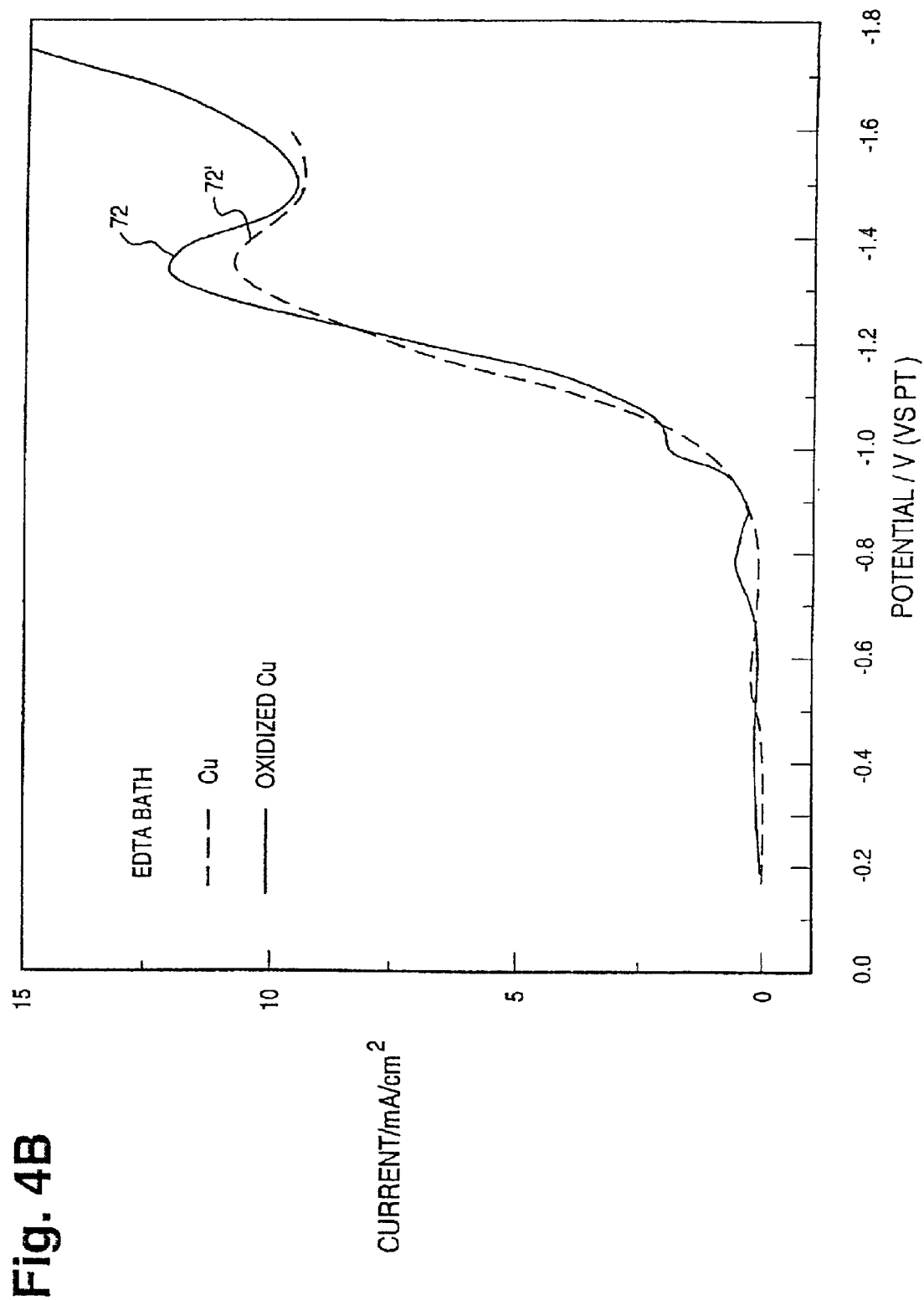
FIG. 4B a graph illustrating the current-potential curves of a plating solution using EDTA, an amine-containing plating solution, as the complexing agent.

A further advantage of using a polycarboxylic acid, such as citric acid, stems from the fact that the magnitude of the voltage potential at which the copper is plated is greater than the magnitude of the voltage potential at which the copper is plated in a bath containing EDTA. This is illustrated in FIGS. 4A and 4B where FIG. 4A is a current-potential graph for a citric acid bath, and FIG. 4B is a current-potential graph for an EDTA bath. Electroplating takes place at the voltage where the corresponding current increases abruptly. This plating voltage is referred to as the deposition potential, which is approximately −1.25 volts as shown in FIG. 4A for a bath employing citric acid as the complexing agent, and is approximately −1.0 volts as shown in FIG. 4B for a bath employing EDTA as the complexing agent. The current peaks (70 70' for the a bath containing a citric acid, and 72, 72' for the bath containing the EDTA) are the limiting currents which are mainly determined by mass transfer and the concentration of copper ions in the plating solutions. As illustrated, the magnitude of the current and the particular plating potential is slightly dependent on the substrate material. The different substrate results are illustrated in FIGS. 4A and 4B, where 70 and 72 are the curves for a copper substrate material, and 70' and 72' are curves for a copper substrate material comprised of copper with a copper oxide coating. It is noted that additional peaks occur on oxidized copper in the same electrolytes. These peaks are related to the electrochemical reduction of copper oxide to metallic copper before the alkaline electrochemical copper deposition.

It is believed that a copper layer plated at a higher plating potential in an alkaline bath provides greater adhesion to the underlying barrier layer than a copper layer plated at a lower plating potential in an acid bath. For copper to adhere to the barrier material, it is thought that copper ions must impinge on the barrier surface with sufficient energy to penetrate a thin oxidized or contaminated layer at the barrier surface. It is therefore believed that a copper layer deposited at a higher magnitude plating potential adhere is better to the exposed barrier layer during the plating process when compared to a layer plated using a smaller magnitude plating potential. This factor, combined with the inter-copper chemical bond between the PVD copper and the electrochemically deposited copper provides for an enhanced seed layer having excellent electrical as well as barrier adhesion properties. Such characteristics are also desirable for films used in blanket plating, full-fill plating, pattern plating, etc.

It has been found that the resistivity of the deposited copper film is directly related to the resistivity of the plating bath solution. Additives that assist in lowering the resistivity of the solution therefore provide a corresponding reduction in the resistivity of the deposited film.

Figure 4C:
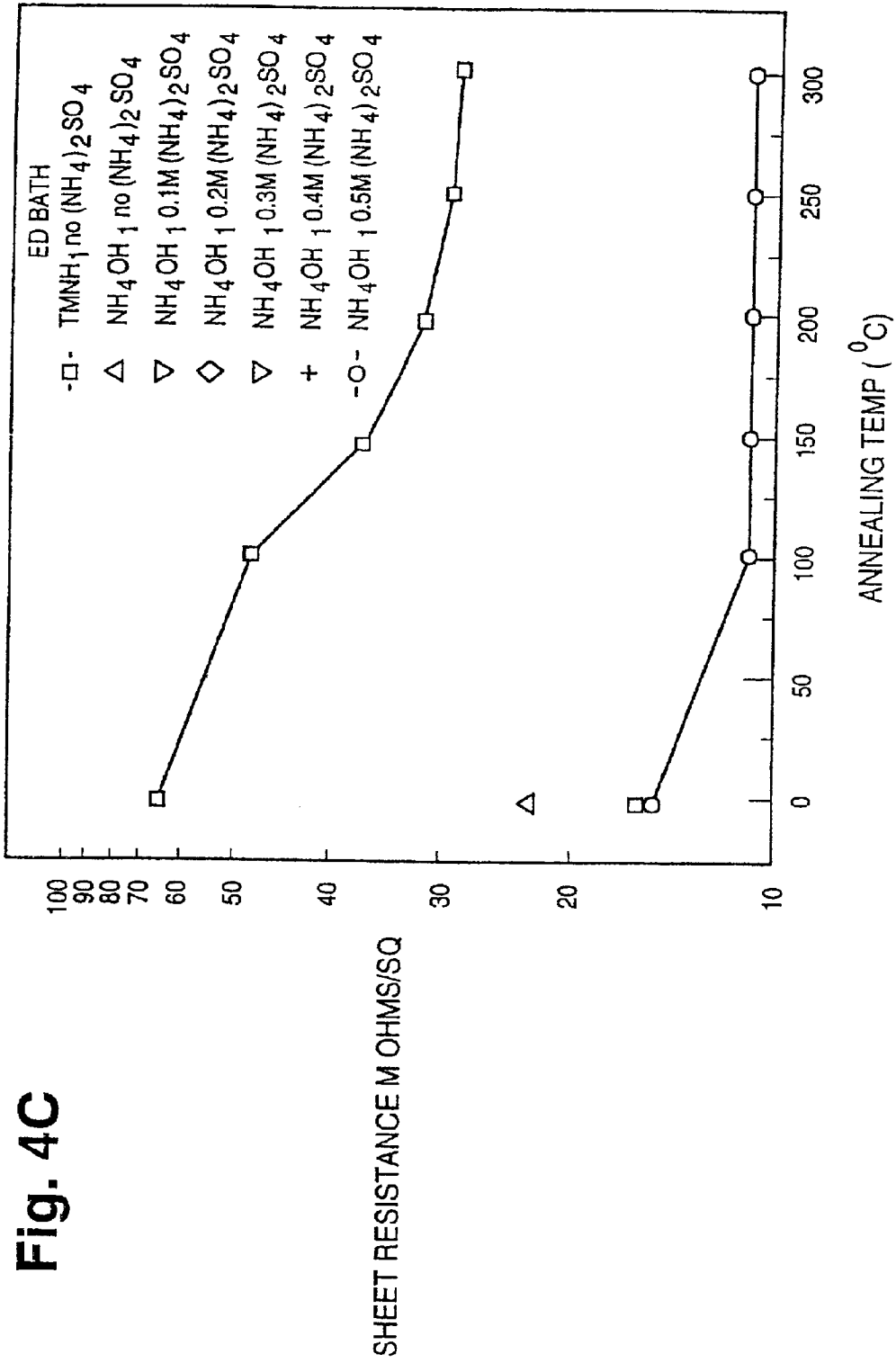
FIG. 4C is a graph of sheet resistance change with annealing temperature for copper films deposited from a bath solution with and without ammonium sulfate.

Experimental results indicate that addition of ammonium sulfate significantly reduces the resistivity of the plating bath solution and, as such, the deposited film. The sheet resistance obtained for different amounts of ammonium sulfate are compared in the graph FIG. 4C. As can be seen, the highest sheet resistance, either with or without annealing at high temperatures, was obtained in the bath containing no ammonium sulfate. If ammonium hydroxide was used to adjust pH in which a trace amount of ammonium sulfate is introduced to the bath, the sheet resistance was reduced from 76 to 23. As the concentration of ammonium sulfate increased from 0.1 M to 0.5 M, the sheet resistance continuously decreased in a corresponding manner.

Figure 4D:
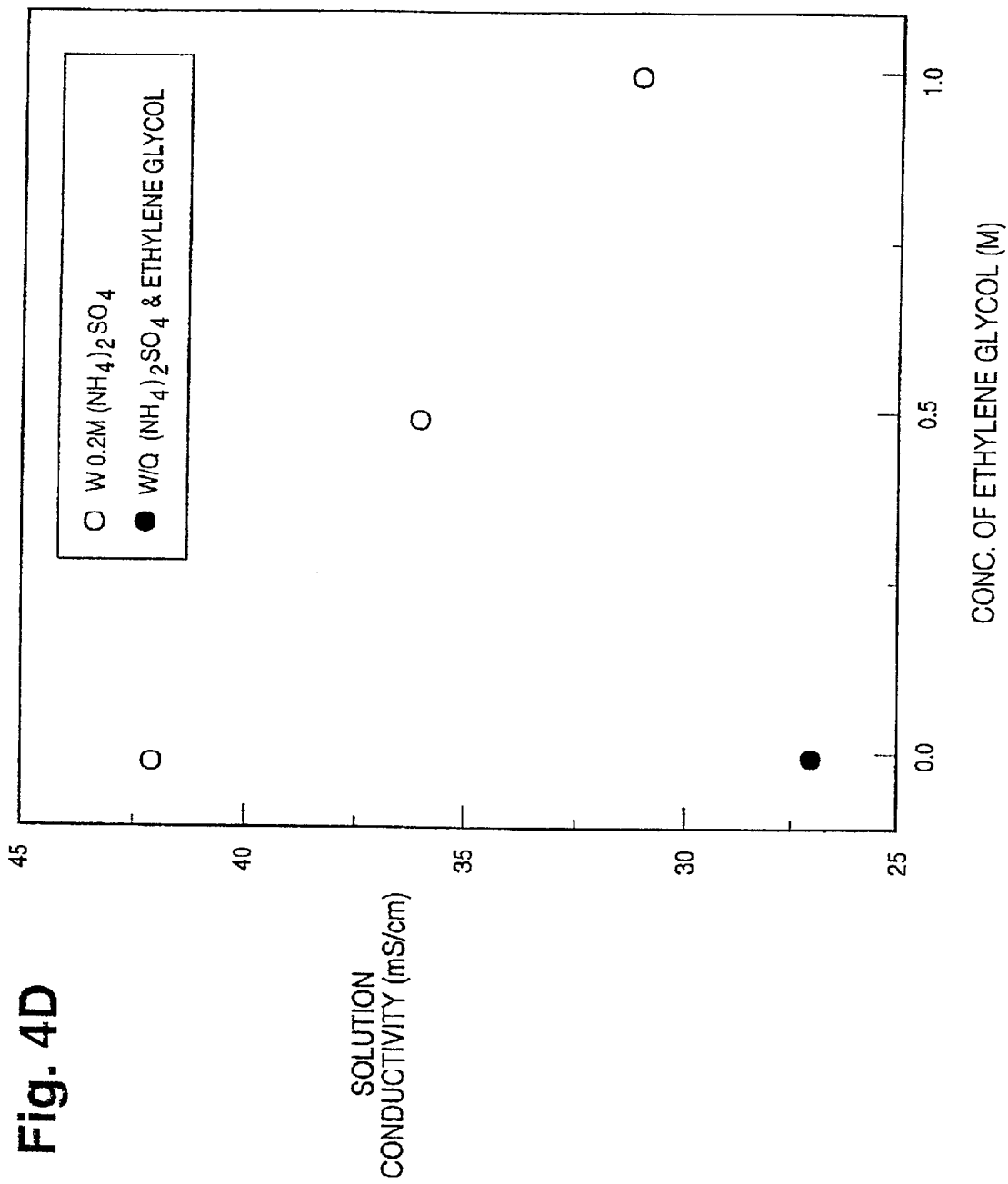
FIG. 4D is a graph illustrating plating solution conductivity as a function of ethylene glycol concentration in collating solutions with and without ammonium sulfate.

Although ammonium sulfate assists in reducing the sheet resistance of the deposited copper layer, experimental results indicate that it reduces the conformality of the resulting copper film. However, the addition of ethylene glycol to the ammonium sulfate containing solution substantially increases the conformality of the resulting deposit. FIG. 4D illustrates the relationship between the concentration of ethylene glycol and the conductivity of a plating solution containing 0.2 M the of ammonium sulfate.

A preferred composition and range of concentrations for the various components of a plating bath having ammonium sulfate include the following:
1. Copper sulfate: 0.03 M to 0.5 M (preferably, 0.25 M);
2. Complexing agent: complex to metal ratios from 1 to 4, preferably 2 using ED;

3. Ammonium sulfate: 0.01 M to 0.5 M, preferably 0.3 M; and
4. Boric acid: 0.00 to 0.5 M, preferably 0.2 M.

As noted above, such a bath composition can be used for blanket plating, pattern plating, full-fill plating, and seed layer enhancement.

With reference again to the specific seed layer enhanced aspects of the present invention, the enhanced seed layer of FIG. 2C is suitable for subsequent electrochemical copper deposition. This subsequent copper deposition may take place in an alkaline bath within the apparatus employed to enhance the seed layer. This may be followed by a low-temperature annealing process that assists in lowering the resistivity of the deposited copper. Such a low-temperature annealing process preferably takes place at a temperature below about the 250 degrees Celsius and, more preferably, below about 100 degrees Celsius. When a low-K dielectric material is employed to isolate the copper structures, the upper annealing temperature limit should be chosen to be below the degradation temperature of the dielectric material.

Figure 2D:
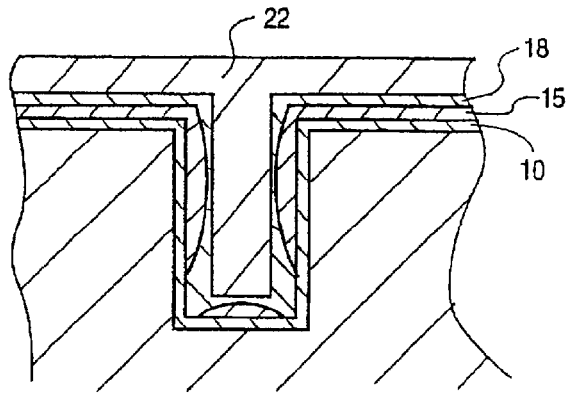
Figure 2E:
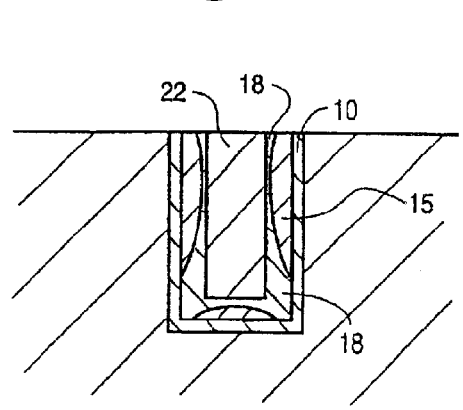

Although the foregoing alkaline bath compositions may be used for the entire electrochemical deposition process, subsequent copper deposition may take place in an acid environment where plating rates are substantially higher than corresponding rates associated with alkaline plating baths. To this end, the semiconductor workpiece is preferably transferred to an apparatus wherein the workpiece is thoroughly rinsed with deionized water and then transferred to an apparatus similar to that of FIG. 3 wherein the plating bath is acidic. For example, one suitable copper bath comprises 170 g/l $H_2SO_4$, 17 g/l copper and 70 ppm Chloride ions with organic additives. The organic additives are not absolutely necessary to the plating reaction. Rather, the organic additives may be used to produce desired film characteristics and provide better filling of the recessed structures on the wafer surface. The organic additives may include levelers, brighteners, wetting agents and ductility enhancers. It is during this deposition process that the trench 5 is substantially filled with a further layer of electrochemically deposited copper 22. The resulting filled cross-section is illustrated in FIG. 2D. After being filled in this manner, the barrier layer and the copper layers disposed above the trench are removed using any suitable process thereby leaving only the trench 5 with the copper metallization and associated barrier material as shown in FIG. 2E.

Use of an alkaline electrolytic bath to enhance the copper seed layer has particular advantages over utilizing acid copper baths without seed layer enhancement. After deposition of the PVD copper seed layer, the copper seed layer is typically exposed to an oxygen-containing environment. Oxygen readily converts metallic copper to copper oxide. If an acid copper bath is used to plate copper onto the seed layer after exposure of the seed layer to an oxygen containing environment, the acid copper bath would dissolve copper oxide that had formed, resulting in voids in the seed layer and poor uniformity of the copper layer deposited on the seed layer. Use of an alkaline copper bath in accordance with the disclosed embodiment avoids the problem by advantageously reducing any copper oxide at the surface of the seed layer to metallic copper. Another advantage of the alkaline copper bath is that the plated copper has much better adhesion to the barrier layer than that plated from an acid copper bath. Additional advantages of the seed layer enhancement aspects of the present invention can be seen from the following Example.

EXAMPLE 1

Comparison of Acid Copper Plating with and without Seed Layer Enhancement

Semiconductor wafers 1, 2 and 3 were each coated with a 200 Angstrom PVD copper seed layer. In accordance with the present invention, wafers 1 and 2 had seed layer enhancement from citric acid and EDTA baths, respectively, the compositions of which are set forth below:

Bath for Wafer 1: 0.1 M $CuSO_4$+0.2 M Citric acid+0.05 M $H_3BO_3$ in D.I. water at pH 9.5, temperature 25° C.

Bath for Wafer 2: 0.1 M $CuSO_4$+0.2 M EDTA acid+0.05 M $H_3BO_3$ in D.I. water at pH 12.5, temperature 25° C.

Wafer 3 did not have any seed layer enhancement.

The three wafers were then plated with a 1.5 micron copper layer from an acid copper bath under identical conditions. The following Table compares the uniformities, as deduced from sheet resistance measurements, of the three wafers after the deposition of a copper layer having a nominal thickness of 1.5 microns.

TABLE 1

| Wafer | Enhancement Bath | Current Density | Non-uniformity Standard deviation (%, 1σ) |
|---|---|---|---|
| 1 | Citrate | 3 min. at 2mA/cm² | 7.321 |
| 2 | EDTA | 3 min. at 2mA/cm² | 6.233 |
| 3 | None | 0 | 46.10 |

As can be seen from the results in Table 1 above, seed layer enhancement in accordance with the disclosed process provides excellent uniformity (6 to 7%) compared to that without seed layer enhancement (46%). This is consistent with observations during visual examination of the wafer after 1.5 micron electroplated copper had been deposited. Such visual examination of the wafer revealed the presence of defects at wafer electrode contact points on the wafer without seed layer enhancement.

Figure 5:
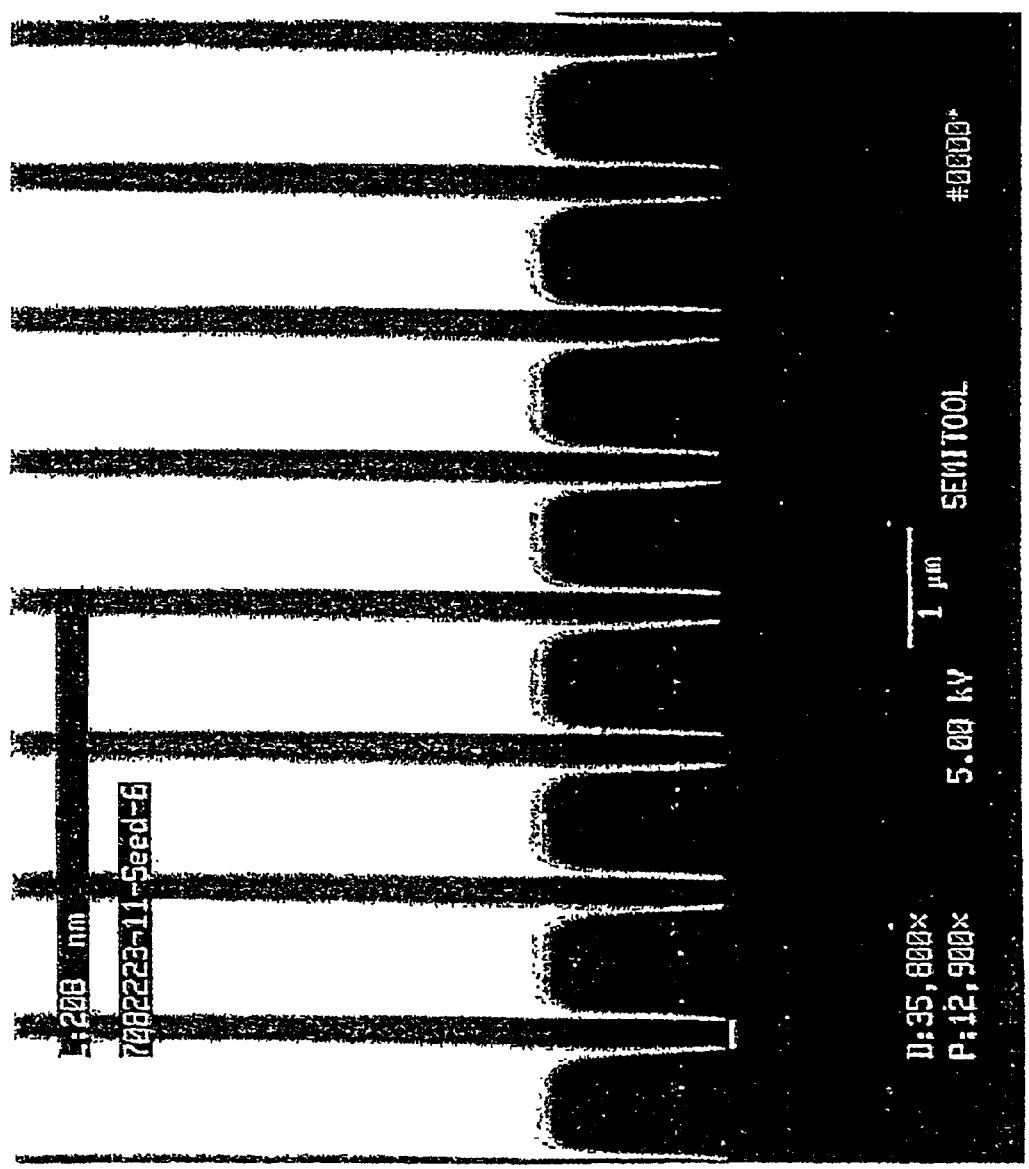
FIG. 5 is a scanning eletromicrograph photograph illustrating an ultra-thin seed layer.
Figure 6A:
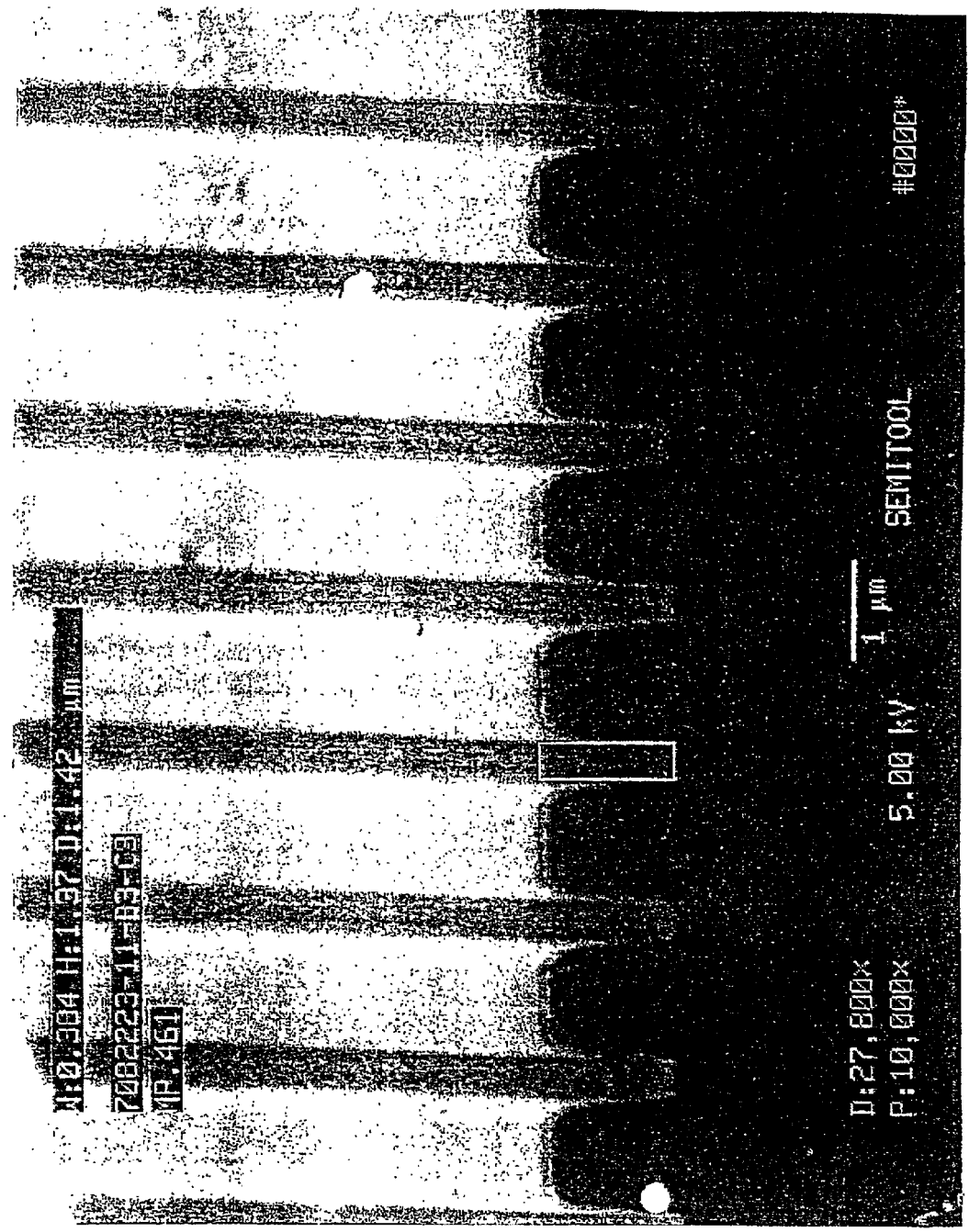
FIG. 6A is a scanning eletromicrograph photograph illustrating an ultra-thin seed layer that has been enhanced in a citric acid bath.
Figure 6B:
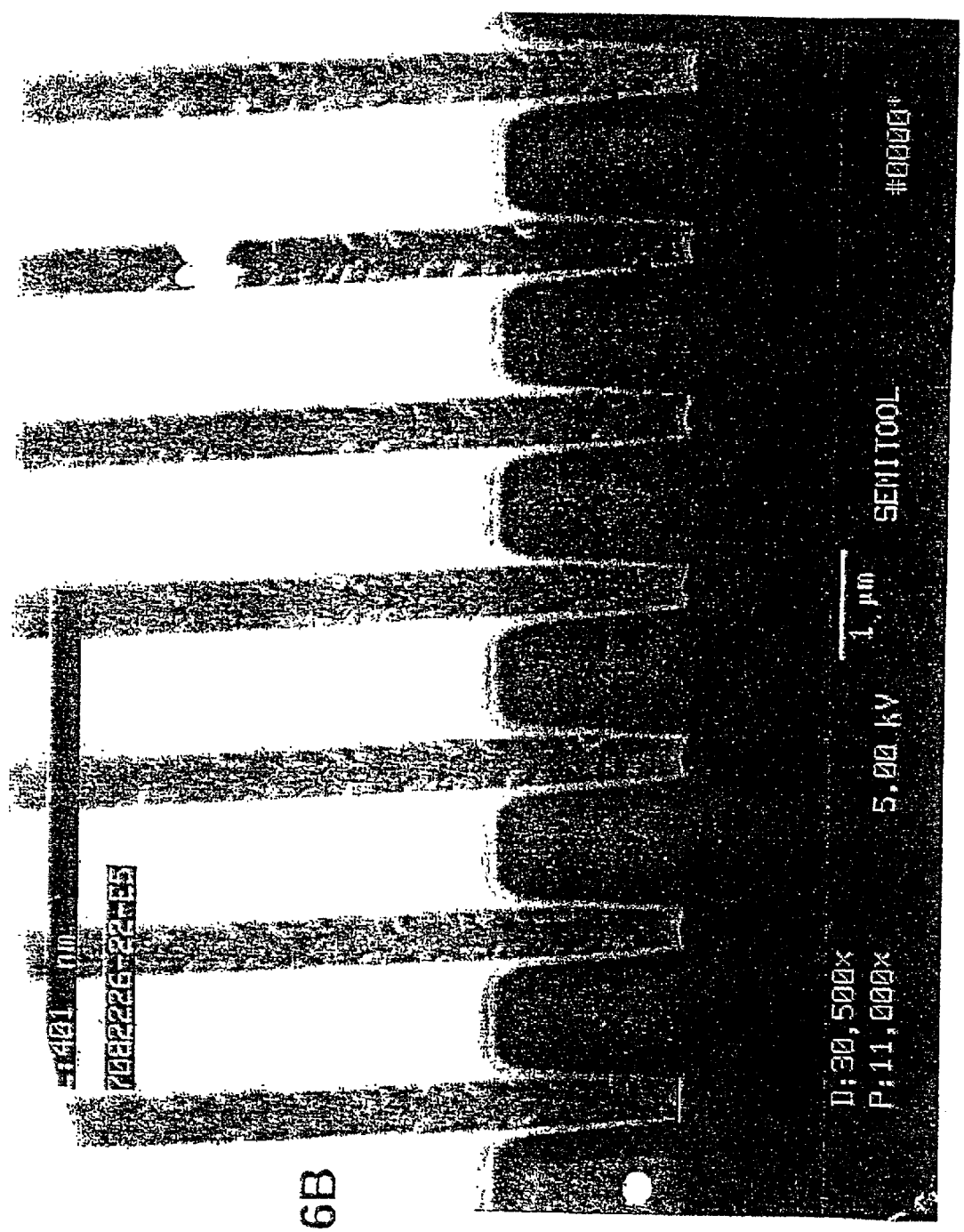
FIG. 6B is a scanning eletromicrograph photograph illustrating an ultra-thin seed layer that has been enhanced in an EDTA bath.

FIGS. 5, 6A and 6B are photographs taken using a SEM. In FIG. 5, an ultra-thin seed layer has been deposited on the surface of a semiconductor wafer, including microstructures, such as trenches 85. As shown, void regions are present at the lower corners of the trenches. In FIG. 6A, the seed layer has been enhanced in the manner described above in a bath containing citric acid as the complexing agent. This enhancement resulted in a conformal copper seed layer that is very suited for subsequent electrochemical deposition of copper metallization.

FIG. 6B illustrates a seed layer that has been enhanced in a bath containing EDTA as the complexing agent. The resulting seed layer includes larger grain sizes that project as spikes from the sidewalls of the trenches. These sidewall grain projections make subsequent electrochemical deposition filling of the trenches more difficult since they localize a higher plating rate resulting in non-uniformity of the subsequent electrochemical deposition. This effect is particularly noticeable in recessed micro-structures having small dimensions. As such, a complexing agent such as citric acid is more preferable when filling small micro-structures. Results comparable for copper baths containing citric acid have also been achieved using ED as the complexing agent.

Figure 7:
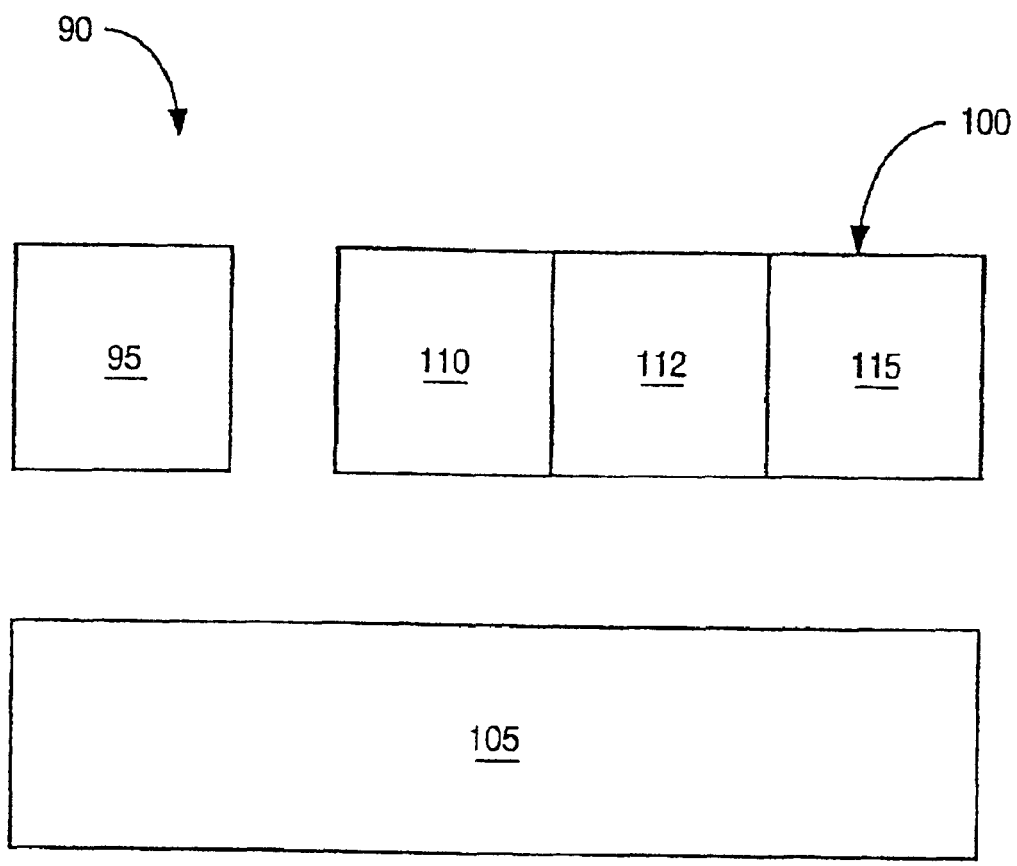
FIG. 7 is a schematic representation of a section of a semiconductor manufacturing line suitable for implementing the disclosed seed layer enhancement steps.

FIG. 7 is a schematic representation of a section of a semiconductor manufacturing line 90 suitable for implementing the foregoing processes. The line 90 includes a vapor deposition tool or tool set 95 and an electrochemical copper deposition tool or tool set 100. Transfer of wafers between the tools/tool sets 95 and 100 may be implemented manually or through an automated transfer mechanism 105. Preferably, automated transfer mechanism 105 transfers workpieces in a pod or similar environment. Alternatively, the transfer mechanism 105 may transfer wafers individually or in an open carrier through a clean atmosphere joining the tools/tool sets.

In operation, vapor deposition tool/tool set 95 is utilized to apply an ultra-thin copper seed layer over at least portions of semiconductor workpieces that are processed on line 90. Preferably, this is done using a PVD application process. Workpieces with the ultra-thin seed layer are then transferred to tool/tool set 100, either individually or in batches, where they are subject to electrochemical seed layer enhancement at, for example, processing station 110. Processing station 110 may be constructed in the manner set forth in FIG. 3. After enhancement is completed, the workpieces are subject to a full electrochemical deposition process in which copper metallization is applied to the workpiece to a desired interconnect metallization thickness. This latter process may take place at station 110, but preferably occurs at further processing station 115 which deposits the copper metallization in the presence of an acidic plating bath. Before transfer to station 115, the workpiece is preferably rinsed in DI water at station 112. Transfer of the wafers between stations 110, 112, and 115 may be automated by a wafer conveying system 120. The electrochemical deposition tool set 100 may be implemented using, for example, an LT-210™ model or an Equinox™ model plating tool available from Semitool, Inc., of Kalispell, Mont.

Numerous modifications may be made to the foregoing system without departing from the basic teachings thereof although the present invention has been described in substantial detail with reference to one or more specific embodiments, those of skill in the art will recognize that changes may be made thereto without departing from the scope and spirit of the invention as set forth in the appended claims.

What is claimed is:

1. A process for applying a metal structure to a workpiece comprising:

providing a first electroplating bath including a source of metal ions as a principal metal species to be deposited during subsequent electroplating, boric acid, and a metal ion complexing agent;

providing a workpiece on which one or more microelectronic devices are to be formed;

exposing at least one surface of the workpiece to the first electroplating bath; and applying electroplating power between the at least one surface of the workpiece and an electrode disposed in electrical contact with the first electroplating bath to electroplate the principal metal species onto the at least one surface of the workpiece in an electrolytic first deposition process, wherein power is applied during at least a portion of the first deposition process for a workpiece surface current density of between 1.0 mA/cm$^2$ and 5.0 mA/cm$^2$.

2. The process of claim 1, wherein power is applied during at least a portion of the first deposition process at a workpiece surface current density of about 2.0 mA/cm$^2$.

3. The process of claim 1, wherein power is applied at a workpiece surface current density of between 1.0 mA/cm$^2$ and 5.0 mA/cm$^2$ over a time period of between 1.0 and 5.0 minutes.

4. The process of claim 1, wherein power is applied in periodic pulses during deposition.

5. The process of claim 4, wherein power is applied in forward pulses having a period of about 2 msec at a 50% duty cycle.

6. The process of claim 1, further comprising depositing additional metal of the same principal metal species onto the metal deposited in the first deposition process using a second deposition process that is different than the first electrolytic deposition process.

7. The process of claim 6, wherein the second deposition process occurs in an acidic electrolytic bath.

8. The process of claim 6, wherein metal is deposited in the second deposition process at a higher rate than in the first deposition process.

9. The process of claim 6, wherein the metal deposited is copper.

10. The process of claim 6, wherein the source of metal ions comprises copper sulfate included at a level of 0.03 to 0.25 M.

11. The process of claim 1, wherein the first electroplating bath comprises an alkaline bath.

12. The process of claim 11, wherein the alkaline bath has a pH of at least 9.0.

13. The process of claim 12, wherein the alkaline bath is pH adjusted with an alkaline agent selected from the group consisting of potassium hydroxide, ammonium hydroxide, tetramethylammonium hydroxide and sodium hydroxide.

14. The process of claim 11, wherein the first electroplating bath includes a conformality increasing agent.

15. The process of claim 14, wherein the conformality increasing agent comprises ethylene glycol.

16. The process of claim 11, further comprising depositing a barrier layer on the surface of the workpiece before the first deposition process.

17. The process of claim 16, wherein metal is plated directly onto the barrier layer in the first deposition process.

18. The process of claim 16, further comprising depositing an ultra-thin seed layer of metal onto the barrier layer before the first deposition process.

19. The process of claim 1, further comprising depositing an ultra-thin seed layer of metal onto the barrier layer before the first deposition process.

20. The process of claim 1, wherein the complexing agent is selected from the group consisting of ED, EDTA, and a polycarboxylic acid.

21. The process of claim 20, wherein the complexing agent is citric acid.

22. The process of claim 1, wherein the source of metal ions comprises copper sulfate, and the complexing agent comprises ED, further comprising tetramethylammonium hydroxide in an amount sufficient to adjust the pH of the solution to at least 9.0.

23. A process for applying a metal structure to a workpiece comprising:

providing a first electroplating bath including a source of metal ions as a principal metal species to be deposited during subsequent electroplating, a metal ion complexing agent and an alkaline agent in an amount sufficient to adjust the pH of the bath to at least 9.0;

providing a workpiece on which one or more microelectronic devices are to be formed;

exposing at least one surface of the workpiece to the first electroplating bath; and applying electroplating power between the at least one surface of the workpiece and an electrode disposed in electrical contact with the first electroplating bath to electroplate the principal metal species onto the at least one surface of the workpiece in an electrolytic first deposition process, wherein power is applied during at least a portion of the first deposition process for a workpiece surface current density of between 1.0 mA/cm$^2$ and 5.0 mA/cm$^2$.

24. A process for applying a metal structure to a workpiece comprising:

providing a first electroplating bath including a source of metal ions as a principal metal species to be deposited during subsequent electroplating, boric acid, and a metal ion complexing agent;

providing a workpiece on which one or more microelectronic devices are to be formed;

exposing at least one surface of the workpiece to the first electroplating bath; and applying electroplating power between the at least one surface of the workpiece and an electrode disposed in electrical contact with the first electroplating bath to electroplate the principal metal species onto the at least one surface of the workpiece in an electrolytic first deposition process, wherein power is applied during at least a portion of the first deposition process in periodic pulses for a workpiece surface current density of between 1.0 mA/cm$^2$ and 5.0 mA/cm$^2$.

25. The process of claim 24, wherein power is applied in forward pulses having a period of about 2 msec at a 50% duty cycle.

26. The process of claim 25, wherein pulsed power is applied for a period of 1.0 to 5.0 minutes.

27. A process for applying a copper structure to a workpiece comprising:

providing a workpiece on which one or more microelectronic devices are to be formed;

depositing an ultra-thin seed layer of copper onto a surface of the workpiece;

providing a first electroplating bath including copper as a source of metal ions as a principal metal species to be deposited during subsequent electroplating and an alkaline agent in an amount sufficient to adjust the pH of the bath to at least 9.0;

exposing the surface of the workpiece to the first electroplating bath; and applying electroplating power between the surface of the workpiece and an electrode disposed in electrical contact with the first electroplating bath to electroplate the principal metal species onto the ultra-thin seed layer in an electrolytic first deposition process, wherein power is applied during at least a portion of the first deposition process for a workpiece surface current density of between 1.0 mA/cm$^2$ and 5.0 mA/cm$^2$.

* * * * *